United States Patent
Kong et al.

(10) Patent No.: US 11,255,023 B2
(45) Date of Patent: Feb. 22, 2022

(54) SILICON SUPPLY PART, AND DEVICE AND METHOD FOR GROWING SILICON MONOCRYSTALLINE INGOT COMPRISING SAME

(71) Applicant: SK SILTRON CO., LTD., Gumi-si (KR)

(72) Inventors: Jung Hyun Kong, Gumi-si (KR); Seong Hun Yun, Gumi-si (KR); Ho Jun Lee, Gumi-si (KR)

(73) Assignee: SK SILTRON CO., LTD., Gumi-si (KR)

( * ) Notice: Subject to any disclaimer, the term of this patent is extended or adjusted under 35 U.S.C. 154(b) by 0 days.

(21) Appl. No.: 16/652,301

(22) PCT Filed: Dec. 5, 2018

(86) PCT No.: PCT/KR2018/015310
§ 371 (c)(1),
(2) Date: Mar. 30, 2020

(87) PCT Pub. No.: WO2019/156323
PCT Pub. Date: Aug. 15, 2019

(65) Prior Publication Data
US 2020/0232116 A1    Jul. 23, 2020

(30) Foreign Application Priority Data
Feb. 7, 2018    (KR) .......................... 10-2018-0015064

(51) Int. Cl.
*C30B 15/02* (2006.01)
*C30B 15/10* (2006.01)
(Continued)

(52) U.S. Cl.
CPC .............. *C30B 15/02* (2013.01); *C30B 15/10* (2013.01); *C30B 15/14* (2013.01); *C30B 15/30* (2013.01); *C30B 29/06* (2013.01)

(58) Field of Classification Search
CPC ......... C30B 15/02; C30B 15/10; C30B 15/14; C30B 15/30; C30B 29/06
See application file for complete search history.

(56) References Cited

U.S. PATENT DOCUMENTS

2006/0060133 A1* 3/2006 Nakashima ............. C30B 35/00
117/218
2011/0036860 A1* 2/2011 Fujiwara ................. C30B 29/06
117/213
(Continued)

FOREIGN PATENT DOCUMENTS

CN    201261817    6/2009
CN    102534755    7/2012
(Continued)

OTHER PUBLICATIONS

European Patent Office, English computer translation of JP 2008-087998 (Year: 2021).*
(Continued)

*Primary Examiner* — Matthew J Song
(74) *Attorney, Agent, or Firm* — KED & Associates, LLP

(57) ABSTRACT

An embodiment provides a silicon supply part including: a silicon supply chamber; a holder provided on an inner wall of a lower region of the silicon supply chamber; a tube elevating vertically by a first cable inside the silicon supply chamber; a guide provided outside the tube and overlapped with the holder vertically; and a stopper elevating vertically by a second cable and inserted into a lower portion of the tube to open and close the lower portion of the tube.

4 Claims, 7 Drawing Sheets

(51) Int. Cl.
*C30B 15/14* (2006.01)
*C30B 15/30* (2006.01)
*C30B 29/06* (2006.01)

(56) References Cited

U.S. PATENT DOCUMENTS

| | | |
|---|---|---|
| 2012/0160156 A1 | 6/2012 | Kato et al. |
| 2014/0033968 A1* | 2/2014 | Giannattasio ........... C30B 31/10 117/19 |
| 2018/0016701 A1* | 1/2018 | Okita ........................ B08B 9/08 |

FOREIGN PATENT DOCUMENTS

| | | |
|---|---|---|
| CN | 204849114 | 12/2015 |
| CN | 107208306 | 9/2017 |
| JP | 2004-083322 | 3/2004 |
| JP | 2008-087998 | 4/2008 |
| JP | 2008087998 A * | 4/2008 ............ C30B 15/02 |
| JP | 2010180072 A * | 8/2010 ............ C30B 15/32 |
| JP | 2017-122014 | 7/2017 |
| KR | 10-2012-0075387 | 7/2012 |
| KR | 10-2013-0079747 | 7/2013 |
| KR | 10-1389162 | 4/2014 |
| KR | 10-2017-0099950 | 9/2017 |
| WO | WO 2010/089816 | 8/2010 |

OTHER PUBLICATIONS

European Patent Office, English computer translation of JP 2010-180072 (Year: 2021).*
International Search Report dated Mar. 15, 2019 issued in Application No. PCT/KR2018/015310.
Korean Notice of Allowance dated Jul. 30, 2019 issued in Application No. 10-2018-0015064.
Chinese Office Action dated Aug. 4, 2021 issued in CN Application No. 201880088921.4.

* cited by examiner

【FIG. 1】
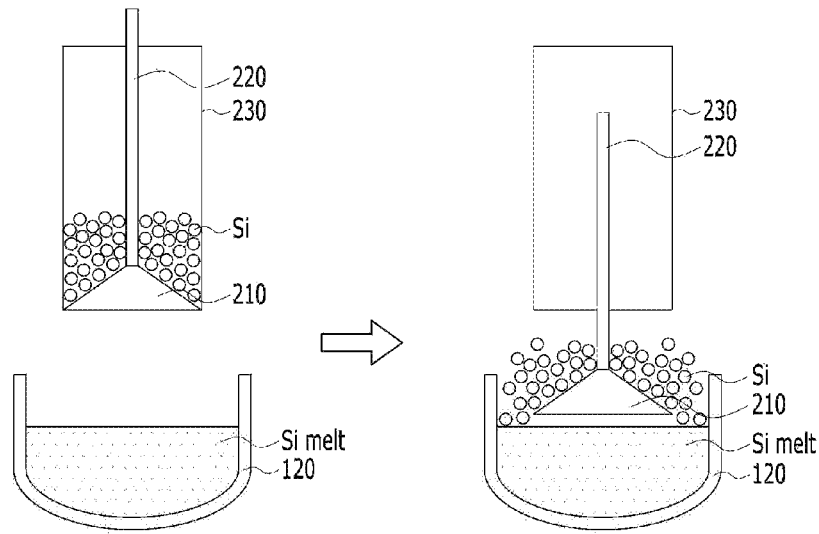
【FIG. 2】
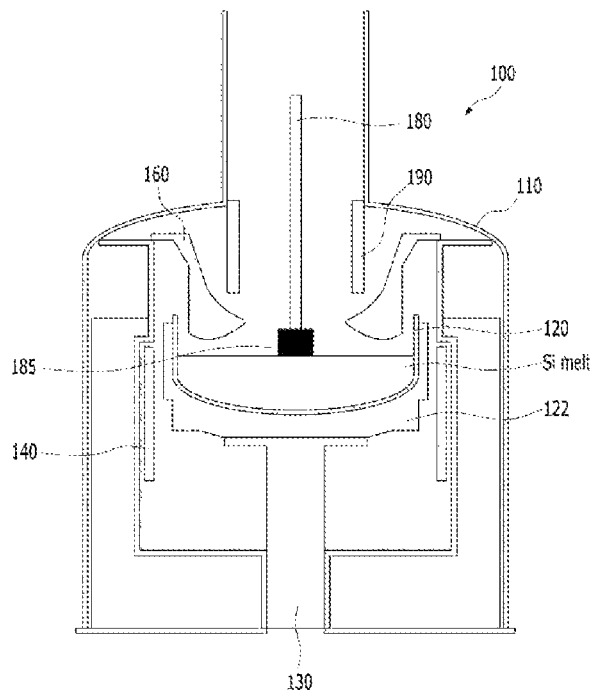

[FIG. 3]
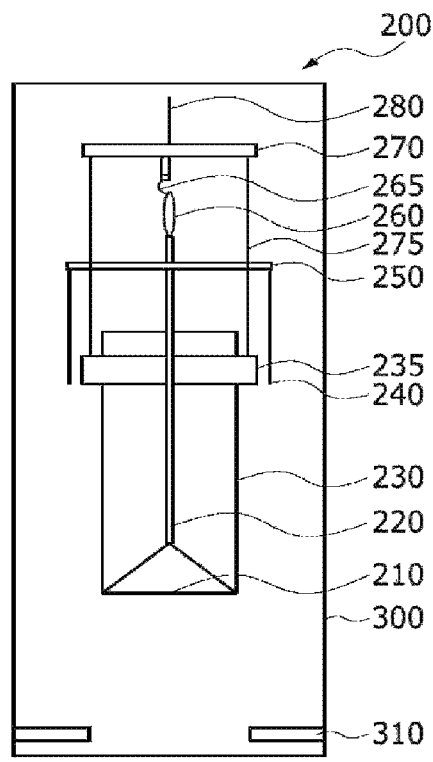
[FIG. 4]
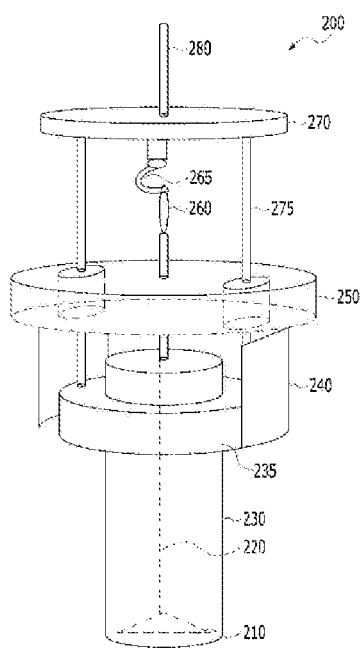

[FIG. 5A]
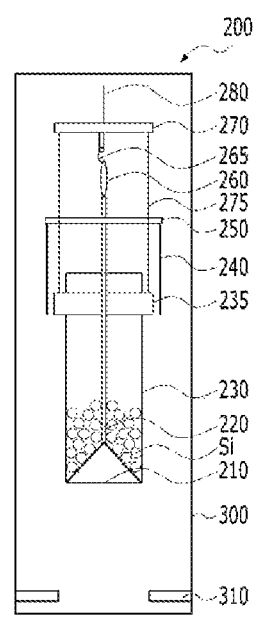
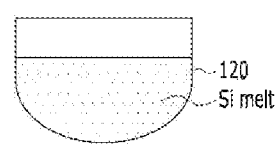

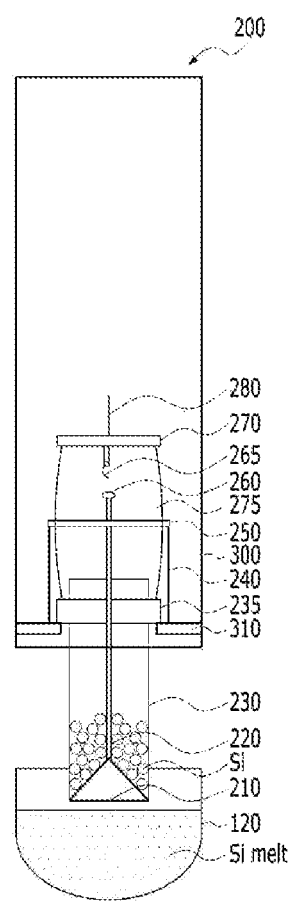
【FIG. 5B】

[FIG. 5C]
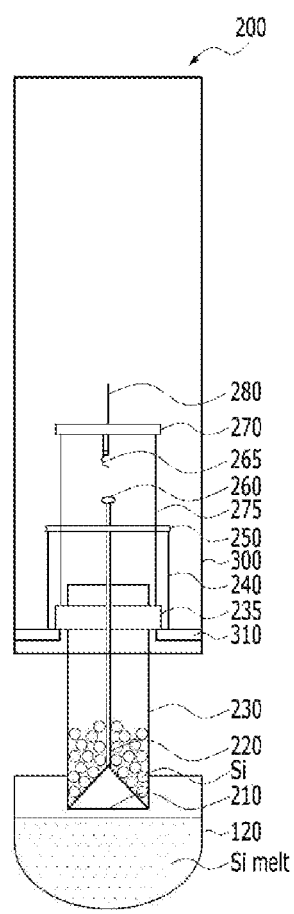

[FIG. 5D]
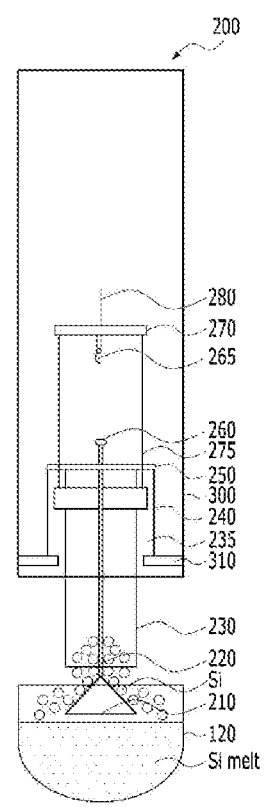

【FIG. 5E】
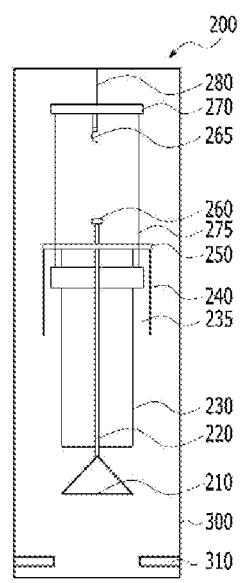
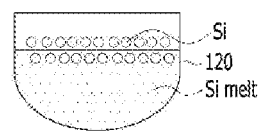

SILICON SUPPLY PART, AND DEVICE AND METHOD FOR GROWING SILICON MONOCRYSTALLINE INGOT COMPRISING SAME

CROSS-REFERENCE TO RELATED PATENT APPLICATIONS

This application is a U.S. National Stage Application under 35 U.S.C. § 371 of PCT Application No. PCT/KR2018/015310, filed Dec. 5, 2018, which claims priority to Korean Patent Application No. 10-2018-0015064, filed Feb. 7, 2018, whose entire disclosures are hereby incorporated by reference.

TECHNICAL FIELD

The embodiment relates to a silicon supply part, a device and a method for growing a silicon single crystal ingot including the same, and more particularly, to a device and a method for preventing damage to a crucible or the like due to spattering of silicon melt when filling a crucible with polycrystalline silicon in a silicon single crystal ingot growing device.

BACKGROUND ART

A silicon wafer used as a material for manufacturing electronic components such as semiconductors or solar cells is manufactured through the steps of slicing a single crystalline silicon ingot to a thin slice in a wafer form, lapping to improve the flatness while polishing the wafer to a desired thickness, etching to remove a damage layer inside the wafer, polishing to improve surface mirroring and flatness, cleaning to remove contaminants on a wafer surface, and the like.

A floating zone (FZ) method or a Czochralski method has been widely used for growing a silicon single crystal ingot. The most generalized method among these methods is the Czochralski method.

In the Czochralski method, a polycrystalline silicon is charged in a quartz crucible and heated and melted by a graphite heating element, and then a single crystal silicon ingot is grown by pulling up a seed while rotating the seed when the seed is immersed in a silicon melt formed as a result of melting and crystallization occurs at an interface.

Specifically, a crucible is raised while rotating a shaft supporting the crucible so that a solid-liquid interface maintains the same height, and the silicon single crystal ingot is pulled up while rotating in an opposite direction to a crucible rotation direction about the same axis as the crucible rotation axis.

FIG. 1 is a view showing a problem when supplying silicon in an ingot growing device.

In a step of charging a polycrystalline silicon (Si) into a crucible 120, an opening surface below a tube 230 is closed by a stopper 210 fixed to a second cable 220. Then, after the tube 230 filled with the polysilicon (Si) is positioned at an upper portion of the crucible 120, the stopper 210 moves downward and the polysilicon in the tube 230 may be supplied to a silicon melt in the crucible 120.

At this time, due to a height difference between the tube 230 and the silicon melt, when the poly silicon strikes the silicon melt, a spattering phenomenon of the silicon melt may occur.

Such a spattering phenomenon may cause damage to the crucible 120 or other device.

DETAILED DESCRIPTION OF INVENTION

Technical Problem

The embodiment is to solve the above-mentioned problems, and is directed to preventing a crucible and other equipment from being damaged due to a spattering phenomenon of a polysilicon at a surface of a silicon melt occurring when the polysilicon is injected into the silicon melt during growth of a silicon single crystal ingot.

Technical Solution

An embodiment provides a silicon supply part including: a silicon supply chamber; a holder provided on an inner wall of a lower region of the silicon supply chamber; a tube elevating vertically by a first cable inside the silicon supply chamber; a guide provided outside the tube and overlapped with the holder vertically; and a stopper elevating vertically by a second cable and inserted into a lower portion of the tube to open and close the lower portion of the tube.

The silicon supply part may further include a ring provided at a lower end of the first cable.

The silicon supply part may further include a latching portion provided at an upper end of the second cable and fastened to the ring.

The silicon supply part may further include a protrusion provided at an edge of the tube, wherein a width of the protrusion may be smaller than that of the guide.

The silicon supply part may further include a plate provided at an upper portion of the tube and through which the first cable passes.

The silicon supply part may further include a connection part connecting a lower surface of an edge of the plate and an upper surface of the protrusion.

The silicon supply part may further include a guide body provided at an upper portion of the tube, wherein the guide may be disposed extending from an edge of the guide body downward.

The second cable may pass through the guide body.

Another embodiment provides a device for growing a silicon single crystal ingot including: a chamber; a crucible provided inside the chamber and accommodating a silicon single crystal melt; a silicon supply part provided at an upper portion of the crucible; a heating unit for heating the crucible; a heat insulating member provided on the upper portion of the crucible; and a rotating shaft for rotating and raising the crucible.

Still another embodiment provides a method for growing a silicon single crystal ingot including: filling a region consisting of a tube and a stopper inserted into an opening of a lower surface of the tube with a polysilicon; positioning the tube at an upper portion of a crucible and lowering the tube in a direction of the crucible; and fixing the stopper and pulling up the tube when the opening of the lower surface of the tube approaches so as to be adjacent to the crucible.

The stopper is connected to a second cable passing through the tube vertically, the second cable is connected to a first cable thereabove, the stopper is fixed by separating the first and second cables, and only the tube may be pulled up.

The first and second cables may be coupled and separated by a ring provided at a lower end of the first cable and a latching portion provided at an upper end of the second cable.

Advantageous Effects

In a silicon supply part according to the embodiment, and a device and a method for growing a silicon single crystal ingot including the same, since a polysilicon falls in a state in which a cone-shaped stopper in the silicon supply part is close to a crucible and a silicon melt, a scattering phenomenon is greatly reduced when the polysilicon enters the silicon melt, thereby preventing damage of the crucible, a tube, and the like.

DESCRIPTION OF DRAWINGS

FIG. 1 is a view showing a problem when supplying silicon in an ingot growing device.

FIG. 2 is a view showing a configuration of one embodiment of an ingot growing device according to an embodiment.

FIG. 3 is a view showing a silicon supply part in the ingot growing device of FIG. 2.

FIG. 4 is a view showing a silicon supply unit in the silicon supply part of FIG. 3.

FIGS. 5A to 5E are views showing an operation of the silicon supply part of FIG. 3.

MODES OF THE INVENTION

Hereinafter, embodiments are provided in order to fully explain the present invention, and will be described in detail with reference to accompanying drawings to help understanding of the invention.

However, the embodiments according to the present invention may be modified into various other forms, and the scope of the present invention should not be construed as being limited to the embodiments set forth herein. The embodiments of the present invention are provided to more fully explain the present invention to those skilled in the art.

In addition, relational terms such as "first" and "second", "upper" and "lower", and the like, without necessarily requiring or implying any physical or logical relationship or order between its entities or elements, may only be used to distinguish one entity or element from another entity or element.

A thickness or size of each layer in the drawings are exaggerated, omitted, or schematically illustrated for convenience and clarity of description. In addition, the size of each component does not fully match the actual size thereof.

FIG. 2 is a view showing a configuration of one embodiment of an ingot growing device according to an embodiment.

In a silicon single crystal ingot growing device 100 according to the present embodiment, a silicon single crystal ingot may be grown by melting solid silicon into a liquid and then recrystallizing the silicon. The silicon single crystal ingot growing device 100 may include a chamber 110 in which a space for growing a silicon single crystal ingot from a silicon (Si) melt is formed therein, first and second crucibles 120 and 122 for accommodating the silicon single crystal melt (Si melt), a heating part 140 for heating the first and second crucibles 120 and 122, a heat insulating member 160 positioned above the first crucible 120 to block heat of the heating part 140 toward the silicon single crystal ingot, a seed chuck 180 for fixing a seed 185 for growing the silicon single crystal ingot, and a rotating shaft 130 rotated by a driving means to rotate and raise the second crucible 122.

The chamber 110 may have a cylindrical shape having a cavity formed therein, and the first and second crucibles 120 and 122 may be positioned in a central region of the chamber 110. The first and second crucibles 120 and 122 may have a concave shape as a whole to accommodate the silicon single crystal melt, and may be made of a material such as tungsten (W) or molybdenum (Mo), but the embodiment is not limited thereto.

In addition, the crucible may include the first crucible 120 made of quartz which is in direct contact with the silicon single crystal melt, and the second crucible 122 made of graphite supporting the first crucible 120 while surrounding an outer surface of the first crucible 120.

In addition, a water cooling tube 190 may be provided above a growing silicon single crystal ingot 140 to cool the silicon single crystal ingot 140.

When supplying a polycrystalline silicon (Si) to the first crucible 120 of the silicon single crystal ingot growing device 100 described above, a following silicon supply part may be used.

FIG. 3 is a view showing a silicon supply part in the ingot growing device of FIG. 2, and FIG. 4 is a view showing a silicon supply unit in the silicon supply part of FIG. 3.

The silicon supply part according to the embodiment may include a silicon supply chamber 300, a holder 310 provided on an inner wall of a lower region of the silicon supply chamber 300, a tube 230 elevating vertically by a first cable 280 inside the silicon supply chamber 300, a guide 240 provided outside of the tube 230 and overlapped with the holder 310 vertically, and a stopper 210 elevating vertically by the second cable 220 and inserted into a lower portion of the tube 230 to open and close the lower portion of the tube 230.

In addition, other components except for the chamber 300 and the holder 310 in the silicon supply part of FIG. 3 may be referred to as a silicon supply unit 200, and configurations moved to inject a polysilicon in a method of growing a silicon single crystal ingot described later, are the silicon supply unit 200.

A ring 265 may be provided at a lower end of the first cable 280, and the ring 265 may be fastened to a latching portion 260 thereunder. The latching portion 260 may be provided at an upper end of the second cable 220.

The first cable 280 may be provided passing through a plate 270, and a connection part 275 may be formed at an edge of a lower surface of the plate 270, and the connection part 275 may be connected to an upper surface of a protrusion 235 provided in an upper region of the tube 230 to maintain a distance between the plate 270 and the tube 230.

The protrusion 235 may be made of quartz, and may be formed to protrude from an edge of the upper region of the tube, and may be formed to be smaller than a width of the guide 240 described later to provide the protrusion 235 inside the guide 240.

A guide body 250 may be provided above the tube 230, and the guide body 250 may be provided between the tube 230 and the plate 270. In addition, the second cable 220 may pass through the guide body 250 and the tube 230 vertically to be connected to the stopper 210 thereunder. The stopper 210 may have a cone shape as shown, but the embodiment is not limited thereto. It is sufficient that the stopper 210 may close or open an opening surface of the lower portion of the tube 230.

The guide 240 may be disposed to extend downward from an edge of the guide body 250. The guide 240 is provided with the holder 310 described above in order to prevent the tube 230 from approaching too much or contacting the silicon melt in a supply process of the polysilicon, and thus the guide 240 may be provided to be overlapped with the holder 310 vertically.

FIGS. 5A to 5E are views showing an operation of the silicon supply part of FIG. 3.

First, as shown in FIG. 5A, the silicon supply part is positioned above the crucible 120. At this time, the crucible 120 may be in a state of being filled with a silicon melt, and the silicon supply part may be the same as that described in the embodiment described above.

At this time, an opening of a lower surface of the tube 230 is closed with the stopper 210, and may be in a state in which a region consisting of the tube 230 and the stopper 210 is filled with polysilicon (Si).

Then, as shown in FIG. 5B, the silicon supply unit 200 is lowered toward the crucible 120 in the silicon supply part. At this time, after the silicon supply unit 200 is lowered, when the guide 240 is fixed above the holder 310 in the silicon supply chamber 300, movement of the silicon supply unit 200 may be stopped.

Then, when the guide 240 contacts the holder 310 and is fixed thereto, the ring 265 and the latching portion 260 may be separated. That is, the stopper 210 may close or open the opening surface of the lower portion of the tube 230 by fastening and separating the ring 265 and latching portion 260.

At this time, the lower surface of the tube 230 and the stopper 210 may approach a position close to the silicon melt in the crucible 120.

Then, as shown in FIG. 5C, the first cable 280 is pulled upward gradually, and the plate 270 and the connection part 275 may be pulled up together with the first cable 280, and the protrusion 235 fixed by the connection part 275 and the tube 230 may be pulled up together.

At this time, the second cable 220 and the stopper 210 fixed to the latching portion 260 may be fixed without being pulled up to be fixed at an upper portion adjacent to the crucible 120.

Then, as shown in FIG. 5D, as a distance between the tube 230 and the stopper 210 is spaced apart, the polysilicon provided in the tube 230 may fall into the crucible 120.

In addition, since the polysilicon in the tube 230 falls in a state in which the stopper 210 is close to the crucible 120 and the silicon melt, a scattering phenomenon may be greatly reduced when the polysilicon enters the silicon melt.

Then, as shown in FIG. 5E, when injection of the polysilicon into the silicon melt is completed, the stopper 210 may also be pulled upward by the second cable 220 connected to the latching portion 260.

Subsequently, a seed is supplied into the silicon melt, and a silicon single crystal ingot may be grown in the order of a neck, a shoulder and a body and a tail.

As described above, although embodiments have been described with reference to limited embodiments and drawings, the present invention is not limited to the above-described embodiments, and a person skilled in the art may make various changes and modifications from such description.

Therefore, the scope of the present invention should not be limited to the embodiments described above, and should be defined by equivalents of the claims as well as the claims that will be described below.

INDUSTRIAL APPLICABILITY

A silicon supply part, a device and a method for growing a silicon single crystal ingot including the same according to the embodiment may be used in growing a silicon single crystal ingot by the Czochralski method.

The invention claimed is:

1. A device for growing a silicon single crystal ingot comprising:
   a chamber;
   a crucible provided inside the chamber and accommodating a silicon single crystal melt;
   the silicon supply part provided at an upper portion of the crucible;
   a heating unit for heating the crucible;
   a heat insulating member provided on the upper portion of the crucible; and
   a rotating shaft for rotating and raising the crucible,
   wherein the silicon supply part includes:
      a silicon supply chamber;
      a holder provided on an inner wall of a lower region of the silicon supply chamber;
      a tube elevating vertically by a first cable inside the silicon supply chamber;
      a guide body provided at an upper portion of the tube;
      a guide provided outside the tube and overlapped with the holder vertically;
      a stopper elevating vertically by a second cable and inserted into a lower portion of the tube to open and close the lower portion of the tube;
      a ring provided at a lower end of the first cable;
      a latching portion provided at an upper end of the second cable and fastened to the ring;
      a protrusion provided at an edge of the tube;
      a plate provided at an upper portion of the tube and through which the first cable passes; and
      a connection part connecting a lower surface of an edge of the plate and an upper surface of the protrusion,
   wherein:
      the guide body is spaced apart from the plate to face each other,
      the ring is provided between the guide body and the plate,
      a width of the protrusion is smaller than that of the guide, and
      when an opening of a bottom surface of the tube is close to the crucible, the ring and the latching portion are separated.

2. The device of claim 1, wherein the guide is provided to extend from an edge of the guide body downward.

3. The device of claim 1, wherein the second cable passes through the guide body.

4. A method for growing a silicon single crystal ingot, the method comprising:
   filling a region consisting of a tube and a stopper inserted into an opening of a lower surface of the tube with a polysilicon;
   positioning the tube at an upper portion of a crucible and lowering the tube in a direction of the crucible; and
   fixing the stopper and pulling up the tube when the opening of the lower surface of the tube approaches so as to be adjacent to the crucible,
   wherein:
      the stopper is connected to a second cable passing through the tube vertically, the second cable is connected to a first cable thereabove, the stopper is fixed by separating the first and second cables, and only the tube is pulled up, and
      when only the tube is raised, the first cable and second cable are coupled or separated by the a ring provided at a lower end of the first cable and a latching portion provided at an upper end of the second cable and fastened to the ring.

* * * * *